331/98 SEARCH ROOM

United States Patent

[11] 3,611,194

[72] Inventors W. Alfred Codd Rochester; Koho Ozone, Webster; Donald C. Rimlinger, Holcomb, all of N.Y.

[21] Appl. No. 888,408

[22] Filed Dec. 29, 1969

[45] Patented Oct. 5, 1971

[73] Assignee Stromberg-Carlson Corporation Rochester, N.Y.

[54] TUNABLE OSCILLATOR CIRCUIT EMPLOYING AN ACTIVE RC NOTCH FILTER CIRCUIT

22 Claims, 5 Drawing Figs.

[52] U.S. Cl. ........ 331/108 R, 331/140, 333/70 CR

[51] Int. Cl. ........ H03b 5/26

[50] Field of Search ........ 333/70 CR; 331/108, 140, 141, 142

[56] References Cited

UNITED STATES PATENTS

| | | | |
|---|---|---|---|
| 3,424,870 | 1/1969 | Breeden et al. | 331/142 |
| 3,457,526 | 7/1968 | Orr | 331/142 |
| 3,521,005 | 7/1970 | Dow et al. | 331/135 |

*Primary Examiner*—John Kominski

*Attorney*—Charles C. Krawczyk

ABSTRACT: A tunable oscillator circuit employing a resistor capacitor (RC) active notch filter in the feedback path. Two variable resistances are included in the oscillator circuit, one for independently setting the notch depth of the filter, and the other for independently adjusting the frequency of oscillation.

Figure 1:
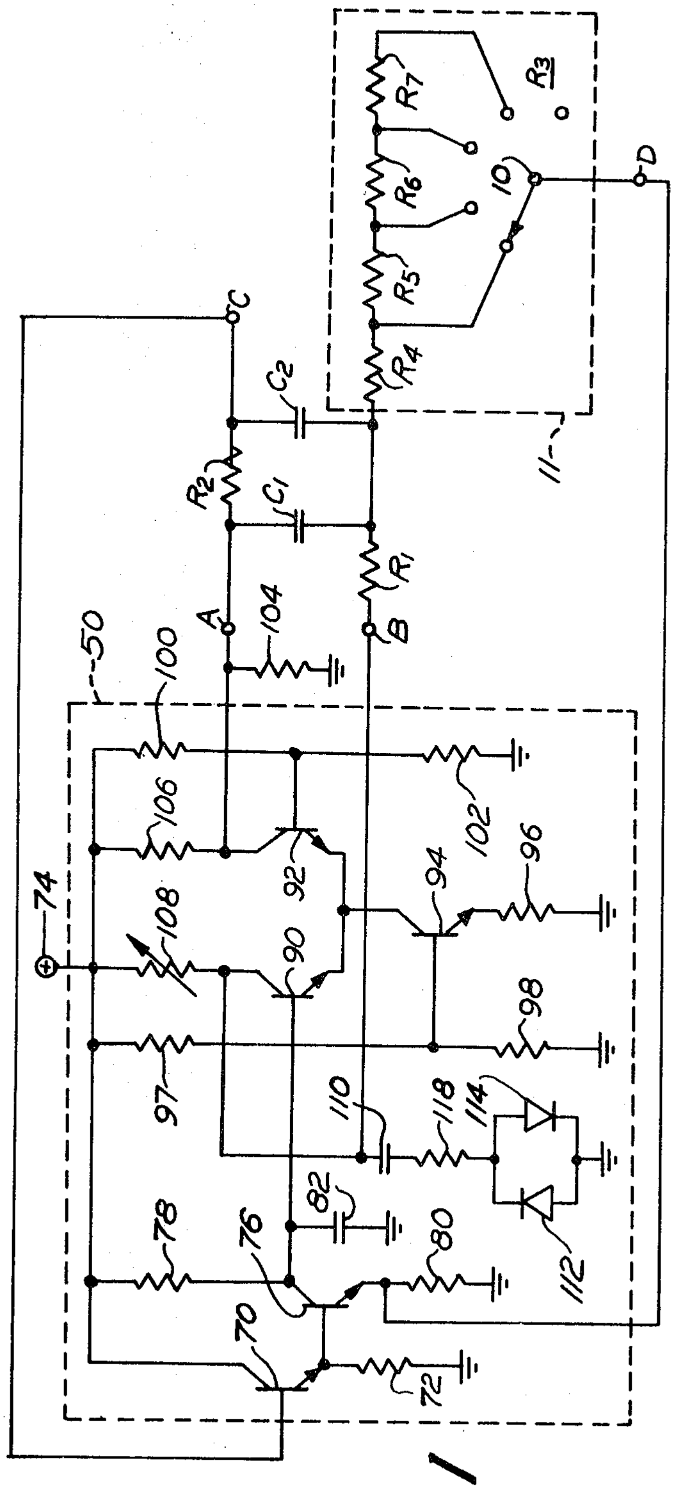

W. A. CODD
K. OZONE
D. C. RIMLINGER
INVENTORS

BY Charles C. Krawczyk
ATTORNEY

W. A. GODD
K. OZONE
D. C. PIMLINGER
INVENTORS

BY
Charles C Krawczyk
ATTORNEY

TUNABLE OSCILLATOR CIRCUIT EMPLOYING AN ACTIVE RC NOTCH FILTER CIRCUIT

BACKGROUND OF THE INVENTION

This invention relates to tunable oscillator circuits in general and more particularly to narrow band resistance capacitance (RC) oscillator circuits including active notch filter circuits.

The advent of multifrequency pushbutton dial types of telephones has resulted in the need for highly stable, simply adjustable, low-cost tunable sine wave oscillators. In addition, the advent of the dial-in-handset telephones that eliminate the conventional telephone set base by locating the voice network and dial assembly in the handset, has also resulted in the need for the substantial reduction in the spaced occupied by the multifrequency oscillator circuits.

The multifrequency pushbutton telephone sets presently in use, include an arrangement wherein inductive filter circuits are switched into an oscillator circuit to provide the various combinations of dial frequencies. The size of the oscillator circuit for such telephone sets have been substantially reduced by the use of RC oscillator circuits that can be fabricated by integrated circuit techniques. The RC oscillator circuits of the prior art employ passive or active twin T-notch filter circuits in the feedback path. Such filters generally comprise a high pass T section in parallel with a low pass T-section.

With RC oscillator circuits, the frequency requirement of the oscillator circuit is achieved by adjusting the time constant of the RC network (the product of resistance R times capacitance C). For accurate frequency control, the time constant of the filter network must be manufactured to close tolerances or else means are required to be provided for adjusting the time constant. It is uneconomical to manufacture capacitors with tolerances less than plus or minus 5 percent. Hence, any adjustments in the time constant of the notch filters are required to be done by adjusting the resistive elements only.

In the RC oscillator circuits of the prior art that employ passive or active twin T-notch networks, any adjustment of the components in the filter to provide its desired notch depth, and to provide the various frequencies, require an extensive calculation to determine which of the resistive elements are to be adjusted, in which direction are the values to be changed, and to what amount the resistive elements are to be changed. This procedure is complicated due to the fact that a change in one resistive element in a twin T-notch filter requires related changes in other resistive elements in order to maintain the desired notch depth in the transmission characteristics of the notch filter. Hence, if various resistive elements are to be switched into and out of the RC oscillator circuits of the prior art in response to the actuation of the pushbutton dial switches, an extensive calculation is required to provide an adjustment procedure to set the various resistive elements to function correctly over all the expected switching arrangements.

The adjustments to the twin T-notch filter circuits were found to be particularly troublesome in the manufacture of integrated RC oscillator circuits as exemplified by an article entitled "Thin Film Technology Enters A New Era" by Lewis A. Priolo and William B. Reichard in Volume Xi, No. 4 of "The Western Electric Engineer," Dec. 1967, pages 44–50. The procedure for adjusting these oscillator circuits set forth in the article requires that the adjustments are made on the various R-components in the notch filter to first set the notch depth and then adjustments are subsequently made on the proper notch filter resistances for frequency. The amount of adjustments are calculated from equations based upon an analysis of the complex transfer function of the twin T-notch filter. Under the assumption that the notch filter depth remains constant, each resistance in the filter circuit was individually varied from its value at the desired notch frequency, and the frequency change for each resistance change was calculated from the transfer function. The network constants and resistance equations were determined from these calculations. An adjustment procedure was then set up from these equations that first required that the notch filter depth be set and the value of the notch filter resistors be measured at each frequency of interest. Using the measured values, the various corrected factors for the resistors are calculated to adjust the proper frequency. Any adjustment in one resistor required corresponding adjustments in other resistors so that the notch filter would maintain a proper notch depth. This highly complex procedure requires a test set to measure the resistors and frequency to store the data, and to compute the correction figures and new resistive values. It would be advantageous for a RC oscillator circuit to be made by integrated circuit techniques wherein the component that controls the notch depth and the frequency of oscillation can be essentially isolated, so that the notch depth and the frequency can be readily and independently adjusted. In addition, it would be highly advantageous to have an RC oscillator circuit of the type wherein the frequency of oscillation can be varied by merely changing one resistive element in the notch filter without substantially changing the notch filter depth.

It is, therefore, an object of this invention to provide a new and improved oscillator circuit including an active RC notch filter circuit in its feedback path.

It is still a further object of this invention to provide a new and improved variable oscillator circuit that is particularly adapted for a fabrication by integrated circuit techniques.

It is also an object of this invention to provide a new and improved variable RC oscillator circuit including a variable resistance in an active notch filter circuit that can vary the frequency of oscillation without changing the notch depth of transmission characteristics of the active notch filter.

It is also an object of this invention to provide a new and improved variable frequency oscillator circuit including an active notch filter in the feedback path wherein the frequency of oscillation can be changed by only changing the value of a single resistive element.

It is also an object of this invention to provide a new and improved variable frequency oscillator circuit including an active notch filter circuit in the feedback path including independent adjustments for setting the notch depth and for adjusting the frequency of oscillation, without interaction.

BRIEF DESCRIPTION OF THE INVENTION

The oscillator circuit of the invention includes an active RC notch filter circuit in the feedback path with one of the resistive elements being variable for selecting the frequency of oscillation. The arrangement of the oscillator circuit is such that any change in the variable resistive element changes the frequency of oscillation and does not affect the notch depth of the transmission characteristics of the filter network, thereby providing an oscillator circuit wherein a continuous frequency adjustment can be made with a single resistive element without degrading the operation of the oscillator circuit. The oscillator circuit also includes an independent adjustment for setting the notch depth for optimum circuit operation without effecting the frequency of oscillation.

A still further feature of the invention includes means whereby nonlinear elements are connected to perform an amplitude stabilization function without introducing harmonic distortion and allowing the active elements to operate in the linear portion of their characteristics thereby keeping the distortion component within the oscillator signals to a low value.

PREFERRED EMBODIMENT OF THE INVENTION

Figure 2:
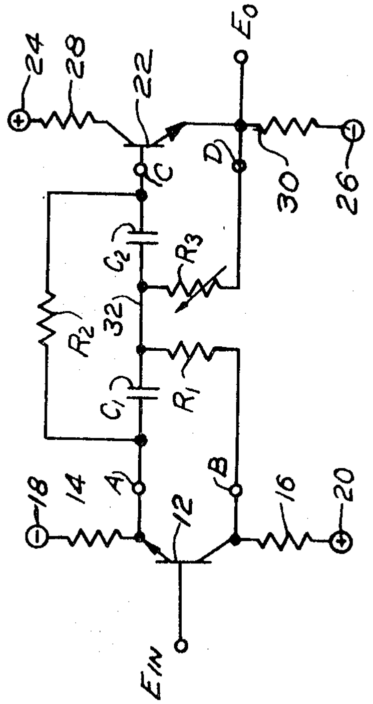

The oscillator circuit of FIG. 1 includes an active RC notch filter network of the type illustrated in FIG. 2. The frequency of oscillation is determined by the values of the resistors R1, R2 and R3 and by the capacitors C1 and C2. The resistors R1, R2 and R3, the capacitors C1 and C2, and the terminals A, B, C and D designate the same elements in each of FIGS. 1–5.

The variable resistor R3 is illustrated in FIG. 1 (within the dashed block 11) as comprising of four separate resistors R4, R5, R6 and R7 for connection into the oscillator circuit by a switch 10. The frequency of oscillation is determined by the position of the switch 10 providing four discrete frequencies of oscillation corresponding to those required for multifrequency pushbutton telephone dialing. The active components (transistors 12 and 22) of the active notch filter circuit of FIG. 2 are combined into the oscillator amplifier circuit, in a manner as will be explained below.

Figure 3:
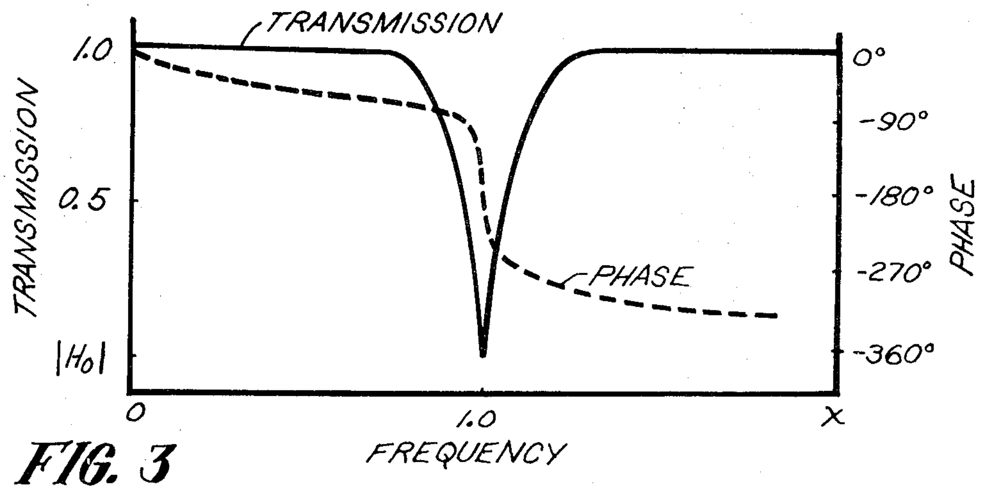

The active notch filter circuit of FIG. 2 includes a transistor 12 connected as an amplifier circuit, having its emitter and collector connected between a pair of power supply terminals 18 and 20 through the resistors 14 and 16, respectively. Signals to be transmitted by the active filter are applied to the input terminal $E_{in}$. The emitter of the transistor 12 is connected to the junctor of the capacitor C1 and the resistor R2 (terminal A). The collector of transistor 12 is connected to one end of the resistor R1 (terminal B). A second transistor 22 is connected as an emitter follower circuit between a pair of power terminals 24 and 26 via the resistors 28 and 30, respectively, to develop an output signal at the terminal $E_o$. The base of the transistor 22 is connected to the junctor of the transistor R2 and the capacitor C2 (terminal C). The emitter of the resistor 22 is connected to one end of the frequency adjusting resistor R3 (terminal D). The other ends of the capacitors C1 and C2 and the resistors R1 and R3 are connected to a common junction point 32. The transfer characteristics and phase shift curve for the active notch filter of FIG. 2 (between the terminal $E_{in}$ and $E_o$) is illustrated in FIG. 3. The arrangement of the components in the active notch filter circuit is selected so that the phase shift of 180° is at the notch (minimum transmission) in the transfer characteristic. Active notch filter circuits are further explained in a publication entitled "Ericsson Technics," Volume 23 (1967), No. 2 by Tore Fjällbrant, pages 259–271.

Figure 4:
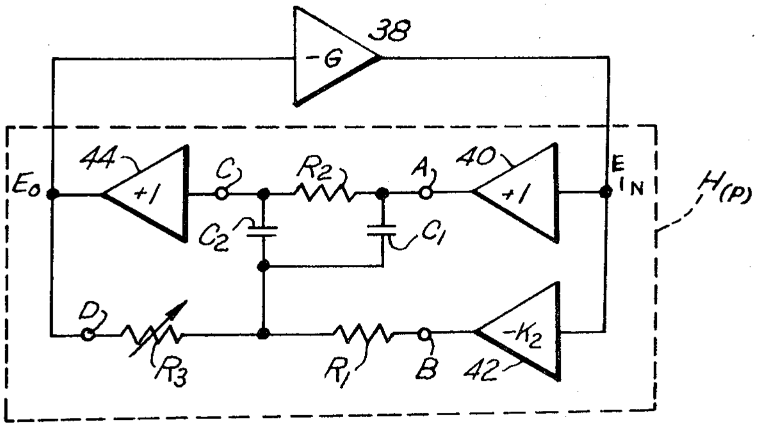

The active notch filter circuit of FIG. 2 is illustrated in simplified form in FIG. 4 (within the dashed block labeled $H_{(p)}$) as a portion of an oscillator circuit connected to provide a positive feedback around an amplifier circuit 38 (having gain −G). The amplifier circuit 40 (having gain +1) represents the emitter output of the transistor 12, the amplifier 42 (having gain $-K_2$) represents the collector output of transistor 12, and the amplifier 44 (having gain +1) represents the output of the emitter follower transistor 22.

The block diagram of the oscillator circuit of FIG. 4 is further simplified by separately combining the active components of the notch filter circuit (amplifiers 40, 42 and 44) and the amplifier 38 into a single amplifier configuration located within the dashed block 50 and is represented by an amplifier 52 (having gain +1) driving a differential or dual output amplifier 54 having a gain of −G at one output terminal A, and a gain of $+K_2$ G at the other output terminal B.

Figure 5:
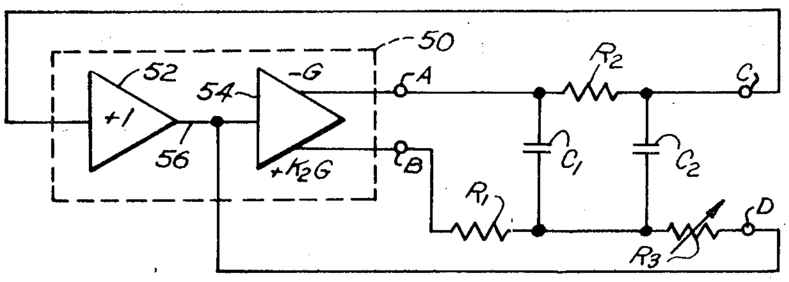

A schematic diagram of the active portion of the oscillator circuit of FIG. 5 is illustrated within the dashed block 50 in FIG. 1. As previously mentioned, the variable resistor R3 (within the dashed block 11) is illustrated in FIG. 1 to include four series resistors R4, R5, R6 and R7 connected to a switch 10 so that the resistors can be switched into the circuit for varying the value of resistor R3 in a stepwise manner to provide four discrete frequencies of oscillation.

The input to the active portion 50 of the oscillator circuit includes a transistor 70 having its emitter connected through a resistor 72 to ground and its collector directly connected to a power supply terminal 74, to function as an emitter follower circuit. The input signals from terminal C of the notch filter network are fed back to the base of the transistor 70. The emitter of the transistor 70 is connected to base of a transistor 76. The transistor 76 is connected as an amplifier stage with its collector connected to the power supply terminal 74 through a resistor 78, and with its emitter connected to ground through a resistor 80. The terminal D of the filter circuit is connected to the emitter of the transistor 76 to provide a feedback path corresponding to that connected between the amplifiers 52 and 54 of FIG. 5. A capacitor 82 is connected between the collector of the transistor 76 and ground to shape the transfer function characteristics of the amplifier circuit.

The three transistors 90, 92, and 94 are connected to form a dual output amplifier circuit corresponding to the amplifier 54 of FIG. 5, with transistor 92 providing the −G output and with the transistor 90 providing the +2 G output. The emitters of the transistors 90 and 92 are connected to the collector of the transistor 94. The emitter of the transistor 94 is connected through a resistor 96 to ground. The base of the transistor 94 is biased by the series resistors 97 and 98 connected between the power terminal 74 and ground. The bias for the base of the transistor 92 is provided by the series resistors 100 and 102. The bias for the base of the transistor 90 is provided from the collector circuit of the transistor 76.

The collector of the transistor 92 is connected to the junction of the resistors 106 and 104 providing an output circuit to the terminal A. The collector of the transistor 90 is connected to the power supply terminal 74 through a notch depth adjusting resistor 108. The collector of transistor 90 is also connected to a nonlinear limiting circuit, including a pair of back-to-back diodes 112 and 114, through a series circuit including a capacitor 110 and a resistor 118. The terminal B is also connected to the collector of the transistor 90.

The advantages and characteristics of the oscillator circuits of FIGS. 1–5 will be explained by means of the following mathematical analysis of the circuit.

The transfer function ($H_p$) of the feedback network can be expressed by the following equation:

$$H(p)=\frac{p^2+Ap+1}{p^2+Bp+1} \qquad \text{(Equation 1)}$$

wherein:

$p=(S/Wo)$ (Equation 2)

$p$—is the normalized complex frequency referenced to the resonant frequency $A$—constant $B$—constant At resonant frequency:

$H_o=(A/B)$ (Equation 3) Wherein $H_o$ is the transfer valve at resonant frequency.

Straight forward analysis of FIG. 2, using the filter components $R_1$, $R_2$, $R_3$, $C_1$ and $C_2$ gives the following relations:

$$w_o=\sqrt{\left(1+\frac{R_1}{R_3}\right)\Big/(R_1C_1R_2C_2)} \qquad \text{(Equation 4)}$$

Where $w_o$ =resonant frequency in radians per second, the constants A and B become:

$$A=\frac{1}{w_oR_1C_1}\left[\frac{R_1}{R_2}\left(1+\frac{C_1}{C_2}\right)-K_2\right] \qquad \text{(Equation 5)}$$

$$B=\frac{1}{w_oR_1C_1}\left[\frac{R_1}{R_2}\left(1+\frac{C_1}{C_2}\right)+1\right] \qquad \text{(Equation 6)}$$

In order to reduce the number of parameters, it can be assumed that:

$R=R_1=R_2$ (Equation 7)

$C=C_1=C_2$ (Equation 8) By substituting equations 7 and 8 into equations 4, 5 and 6, we get:

$$w_o=\frac{1}{RC}\sqrt{1+(R/R_3)} \qquad \text{(Equation 9)}$$

$$A=\frac{2-K_2}{\sqrt{1+(R/R_3)}} \qquad \text{(Equation 10)}$$

$$B=\frac{3}{\sqrt{1+(R/R_3)}} \qquad \text{(Equation 11)}$$

Hence, $$H_o=\frac{A}{B}=\frac{2-K_2}{3} \quad \text{(Equation 12)}$$

$$Q=\frac{H_o-1}{BH_o}=\left[\frac{K_2+1}{(K_2-2)}\right]\cdot\left[\frac{\sqrt{1+(R/R_3)}}{3}\right] \quad \text{(Equation 13)}$$

As noted by equation 12, the transmission characteristics of the active notch filter is independent of the resonant frequency and only depends upon the gain factor $K_2$ of the amplifier 42 (FIG. 4). Hence, the notch depth of the filter circuit can be set for optimum operation in the oscillator circuit by merely setting the gain amplifier 42 ($K_2$) by adjusting the variable resistor 108 (FIG. 1). With the resistive components $R_1$ and $R_2$ equal, and with capacitive components $C_1$ and $C_2$ equal, the gain $K_2$ is required to be adjusted to be greater than 2 (equation 12).

Furthermore, the gain $K_2$ is not an absolute gain magnitude, but corresponds to ratio of the amplitude of the signals between the terminals A and B (FIGS. 1, 4 and 5). Hence, the use of a dual output amplifier essentially minimizes problems due to shift in operating conditions due to temperature and power supply changes. When the temperature and power supply output changes, any changes in the operating condition of the transistors 90 and 92 are in the same direction, essentially maintaining the ratio of the signals at terminals A and B substantially constant.

The constant B specified in Equation 1 does not have a fixed minimum value (Equation 6). Hence, the constant B for the active filter circuits of FIGS. 1, 2, 4 and 5 can be made very small, therefore, depending upon the range of values for resistor $R_3$, the Q of the filter circuit can be set to a very high value (see Equation 13).

The resonant frequency of the notch filter circuit of FIGS. 1, 2, 4 and 5 can be varied by merely changing the value of a single resistor $R_3$ (see Equation 9). This change, according to Equation 12, does not change the transmission value of the circuit, $H_o$. This is important, since for stable operation over a desired range of selectable oscillator frequencies, it is required that the notch depth in the transmission characteristic of the filter network remains constant to maintain the same operating parameters throughout its frequency range of operation. If the notch depth of the notch filter transmission characteristic changes with frequency, the operating parameters of the active elements would be required to be changed as a function of the changes in notch depth to maintain the condition $1-GH_{(p)}=0$ required for oscillation. Hence, in such an arrangement, the gain of the amplifier would be required to change to compensate for changes in notch depth to maintain the oscillatory conditions. Changing the gain requirement with frequency changes may cause the amplifier circuit to be overloaded and driven into saturation, and if sufficient gain is not available, it may even fail to oscillate at needed frequencies. It should be noted that any overloading of amplifier circuits results in introducing added nonlinearities into the circuit. Any nonlinearities, unless carefully controlled by design, will cause distortion into the wave shape of the oscillation by introducing undesirable harmonics.

Since the frequency of oscillation of the oscillator circuit of the invention can be adjusted independently of notch depth (Equation 9), the frequency of oscillation can be continuously varied over the desired range without changing the operating parameters of the active elements (amplifier 50) thereby providing a very stable arrangement. Furthermore, according to equation 12, since the notch depth can be set by adjusting the resistor 108 (FIG. 1), the operating parameters of the active element (amplifier 50) can be set independently of the frequency of oscillation.

The amplitude stabilization of the oscillator circuit of FIG. 1 is implemented by introducing the diodes 112 and 114. These diodes function as nonlinear elements so that the transmission factor ($H_o$) is automatically adjusted to maintain the $(1-GH_{(p)}=0)$ condition for oscillations. The transistors 70, 76, 90, 92 and 94 therefore are assured to operate in a linear portion of their characteristics, thereby keeping the distortion component within the oscillation signals very low. According to Equations 5 and 12, the gain factor $K_2$ at terminal B (output at the collector of the transistor 90) can be made nonlinear to perform the required amplitude stabilization function without affecting the frequency of oscillation.

The RC components in the filter circuit of FIG. 1 were selected to have the following values: (these are exemplary only and should not be taken as limitations)

TABLE I

| | |
|---|---|
| $C_1$ | 0.005 mfd. |
| $C_2$ | 0.005 mfd. |
| $R_1$ | 56 Kilohms |
| $R_2$ | 56 Kilohms |

The nominal values of Q and $H_o$ were taken to be:

$Q=10$, $H_o=-1/30$ (Equation 14) These values provide about 23 db. of second harmonic rejection. From equation 12, the nominal value of $K_2$ is found to be 2.1. Hence, with the components selected as specified in equations 7 and 8, the output of the in-phase amplifier (transistor 90) is required to be about 6 db. greater than the output of out-of-phase amplifier (transistor 92).

The value of $R_3$ for frequencies for use in pushbutton dial type telephones is set forth as follows:

TABLE II

| $R_3$ Kilohm | frequency Hertz |
|---|---|
| ∞ | 547 |
| 94 | 708 |
| 30 | 974 |
| 8 | 1685 |

Table II shows the performance of the oscillator circuit for frequency between 547 and 1685 Hertz can set by merely selecting the corresponding value of the resistor $R_3$.

Although in the above example and equation 12, the gain factor $K_2$ has been selected to be approximately 2 and thereby requires a gain of 6 db. greater than $1/H_o$, it should be noted, that the $K_2$ factor is not necessarily so limited. An examination of the Equation 5 shows that the gain factor $K_2$ can be reduced by changing the proportion of the values selected for the resistors $R_1$ and $R_2$ and $C_1$ and $C_2$. For example, it can be assumed that the capacitor $C_1$ and $C_2$ are equal and the resistance R can be selected as follows:

$R=R_1=R_{2/2}$ (Equation 15) By substituting these conditions into the Equation 3, 4 and 5, we can derive the following relationships:

$$H_o=\frac{1-K_2}{2} \text{ where } K_2\geq 1 \quad \text{(Equation 16)}$$

$$Q=\left(\frac{K_2+1}{K_2-1}\right)\left(\frac{\sqrt{1+(R/R_3)}}{2\sqrt{2}}\right) \quad \text{(Equation 17)}$$

By using the parameters of Equation 14 in solving for $Q$ and $H_o$, we find that the gain factor:

$K_2=1.07$ (Equation 18) Hence, it is clear that there is considerable flexibility in the choice of the value for the gain factor $K_2$.

It should be noted that the RC type of notch filter included in the oscillator circuit of the invention only requires five critical passive elements as compared to the Wein bridge and twin T-network, which include six. The reduction of the one of the critical components reduces the complexity of the circuit, eases its manufacture, and also reduces its cost.

In operation, the amplifiers 52 and 54 (within the dashed block 50 of FIG. 5) amplify the oscillator signals developed at the terminals C and D and apply them to the input of the filter circuit terminals A and B with a phase shift of 180°. The RC notch filter provides an additional phase shift of 180° over a continuous range of frequencies determined by the setting of the resistor $R_3$. The frequency exhibiting the 180° phase shift creates a regenerative feedback, that, with sufficient amplifier gain, results in a sustained oscillation. As noted in FIG. 3, the frequency having the 180° phase shift falls within the bottom of the notch of the filter transmission characteristics. The use of the active notch filter circuit in the feedback path provides a high Q and therefore a steep phase transition in the vicinity of 180° (filter notch) thereby providing excellent stability for the oscillator circuit.

What is claimed is:

1. An oscillator circuit comprising amplifier circuit means having an input circuit and two output circuits, an active RC frequency-determining network having a notch-type transmission characteristic, circuit means connecting the network between the input circuit and output circuits as a feedback circuit for determining the frequency of oscillation, circuit means in said amplifier means for adjusting the ratio of the amplitude of the signals at said output circuits and thereby changing the notch depth of said network without substantially effecting the frequency of oscillation, and circuit means for adjusting the frequency of oscillation without substantially changing the notch depth.

2. An oscillator circuit as defined in claim 1 wherein said two output circuits of said amplifier means applies out-of-phase signals to said active RC network.

3. An oscillator circuit as defined in claim 1 wherein said active RC network includes first, second, third, and fourth terminals, first resistive means connected between said first and second terminals, second and third resistive means connected in series between said third and fourth terminals, first capacitive means connected between said first terminal and the junction of said second and third resistors, and second capacitive means connected between said second terminal and said junction and circuit means connected between said second and fourth terminal so that said network functions as an active notch filter.

4. An oscillator circuit as defined in claim 3 including circuit means coupling said first and third terminals to the output circuits of said amplifier means, and circuit means coupling said circuit means connected to said second and fourth terminals to the input circuit of said amplifier means.

5. An oscillator circuit as defined in claim 4 wherein said circuit means for adjusting the frequency of said oscillation includes the resistive means connected to said fourth terminal.

6. An oscillator circuit as defined in claim 5 wherein said amplifier means includes a dual output amplifier circuit having its output circuits coupled to said first and third terminals for applying an out-of-phase signal therebetween.

7. An oscillator circuit as defined in claim 6 wherein said circuit means for adjusting the notch depth includes variable means connected in the circuit of said dual output amplifier.

8. An oscillator circuit as defined in claim 7 including nonlinear circuit means coupled to the dual output amplifier output circuit connected to said third terminal.

9. An oscillator circuit as defined in claim 6 wherein said amplifier means includes a first amplifier circuit driving said dual output amplifier circuit and wherein said second terminal is coupled to the input circuit of said first amplifier circuit and said fourth terminal is coupled to the output circuit of said first amplifier.

10. An oscillator circuit comprising:

amplifier circuit means having an input circuit and two output circuits, active RC notch filter circuit means, circuit means for connecting said filter circuit means between the input circuit and the output circuits of said amplifier circuit means in a feedback loop for determining the frequency of oscillation wherein out-of-phase signals are applied from said output circuits to said filter circuit means, means for adjusting one of said elements in said RC filter circuit for controlling the frequency of oscillation without substantially changing the notch depth characteristic of said RC filter circuit, and circuit means in said amplifier circuit means for controlling the ratio of the amplitude of the signals at said output circuits.

11. An oscillator circuit as defined in claim 10 wherein said circuit means for controlling said ratio adjusts the notch depth characteristics of said filter without substantially changing the frequency of oscillation.

12. An oscillator circuit comprising:

an amplifier means including a first amplifier driving a dual output amplifier;

filter means including first and second, third and fourth terminals, a first resistive means connected between said first and third terminals, second and third resistive means connected in series between said second and fourth terminals, respectively, said third resistive means being variable for adjusting the frequency of oscillation, a first capacitive means connected between said first terminal and the junction of said second and third resistive means, and second capacitive means connected between said third terminal and said junction;

circuit means coupling said first and second terminals to the output circuit of said dual output amplifier;

circuit means coupling said third terminal to the input circuit of said first amplifier, and circuit means coupling said fourth output terminal to the input circuit of said dual output amplifier.

13. An oscillator circuit as defined in claim 12 wherein:

said first amplifier circuit has unity gain;

the dual output amplifier output circuit coupled to said first terminal provides a signal that is out-of-phase with its input signals, and the dual output amplifier output circuit coupled to said second terminal provides a signal that is in-phase with its input signal.

14. An oscillator circuit as defined in claim 12 wherein:

the output circuit of said dual output amplifier coupled to said second terminal includes variable gain means.

15. An oscillator circuit as defined in claim 14 wherein:

the output circuit of said dual output amplifier coupled to said second terminal includes a nonlinear circuit for amplitude stabilization.

16. An oscillator circuit comprising:

first amplifier means including an input circuit, and first in-phase output circuit having unity gain and an out-of-phase output circuit having a gain factor K;

second amplifier means including an input circuit and an in-phase output circuit having unity gain;

third amplifier means having an input circuit and a gain G greater than unity;

first resistive means coupled between the input circuit of said second amplifier means and said unity gain output circuit of said first amplifier means;

second and third resistive means coupled in series between the output circuit of said second amplifier means and the K-output of said first amplifier means, the resistive means coupled to second amplifier means output circuit being variable;

first and second capacitive means coupled between opposite ends of said first resistive means and the junction of said second and third resistive means;

circuit means coupling the input circuit of said third amplifier means to the output circuit of said second amplifier means, and circuit means coupling the output circuit of said third amplifier means to the input circuit of said first amplifier means.

17. An oscillator circuit as defined in claim 16 wherein:

the circuit including the first and second amplifier means, said first, second and third resistive means and said first and second capacitive means define a notch filter circuit, and including circuit means for adjusting the gain K of said first amplifier means wherein the K controls the notch depth of said filter circuit without changing the resonant frequency of said oscillator circuit.

18. An oscillator circuit as defined in claim 16 wherein:

the circuit including the first and second amplifier means, said first, second and third resistive means and said first and second capacitive means define a notch filter circuit, and wherein said variable resistive means changes the frequency of oscillation without changing the notch depth of said filter circuit.

19. An oscillator circuit comprising:

notch filter circuit means including a plurality of capacitive and resistive elements;

means for varying one of said elements;

amplifier means including an input circuit and two output circuits and means for varying the ratio of the amplitude of the signals between said two output terminals;

circuit means connecting said two output circuits to said filter circuit means to apply amplified signals thereto;

circuit means connecting the filter circuit means to the input of said amplifier means to function as an oscillator circuit, wherein the frequency of oscillation is variable without substantially changing the depth of notch characteristics of said filter circuit by said means for varying one of said elements, and wherein the depth of the notch characteristic of said filter circuit is variable without substantially changing the frequency of oscillation by varying the ratio of the signals at said output terminals.

20. An oscillator circuit as defined in claim 19 wherein the output of said amplifier means is connected to said filter circuit means to apply out-of-phase signals thereto.

21. An oscillator circuit as defined in claim 20 wherein said filter circuit means is an active filter circuit.

22. An oscillator circuit comprising amplifier means including an input circuit and two output circuits, a notch filter circuit including resistor means $R_1$, $R_2$ and $R_3$, and capacitor means $C_1$ and $C_2$, circuit means connecting said notch filter circuit between the input circuit and the output circuits of said amplifier circuit, wherein the frequency of oscillation $W_o$ in radians per second is define by the equation $$W_0=\sqrt{\left(1+\frac{R_1}{R_3}\right)/(R_1C_1R_2C_2)}$$

and wherein the frequency response $H_o$ at the oscillation frequency is defined by the equation $$H_0=\frac{\frac{R_1}{R_2}\left(1+\frac{C_1}{C_2}\right)-K_2}{\frac{R_1}{R_2}\left(1+\frac{C_1}{C_2}\right)+1}$$

and wherein $K_2$ is the ratio of the amplitude of the signals across said output circuits.